United States Patent
Vergnes

(10) Patent No.: US 6,791,355 B2
(45) Date of Patent: Sep. 14, 2004

(54) SPARE CELL ARCHITECTURE FOR FIXING DESIGN ERRORS IN MANUFACTURED INTEGRATED CIRCUITS

(75) Inventor: Alain Vergnes, Trets (FR)

(73) Assignee: Atmel Corporation, San Jose, CA (US)

( * ) Notice: Subject to any disclaimer, the term of this patent is extended or adjusted under 35 U.S.C. 154(b) by 2 days.

(21) Appl. No.: 10/352,470

(22) Filed: Jan. 27, 2003

(65) Prior Publication Data

US 2004/0080334 A1 Apr. 29, 2004

(30) Foreign Application Priority Data

Oct. 25, 2002 (FR) .............................. 02 13399

(51) Int. Cl.$^7$ ........................ H01L 25/00; H03K 19/177
(52) U.S. Cl. ............................................. 326/41; 714/7
(58) Field of Search .............................. 326/41, 38, 93;
714/7, 710, 5; 365/200; 716/4; 327/202

(56) References Cited

U.S. PATENT DOCUMENTS

| | | | |
|---|---|---|---|
| 3,434,116 A | | 3/1969 | Anacker |
| 4,551,814 A | | 11/1985 | Moore et al. |
| 5,161,157 A | | 11/1992 | Owen et al. |
| 5,655,069 A | * | 8/1997 | Ogawara et al. .............. 714/10 |
| 5,696,943 A | | 12/1997 | Lee |
| 5,920,765 A | | 7/1999 | Naum et al. |
| 5,959,905 A | * | 9/1999 | Payne ........................ 365/200 |
| 6,107,820 A | | 8/2000 | Jefferson et al. ............... 326/38 |
| 6,154,851 A | | 11/2000 | Sher et al. |
| 6,166,559 A | | 12/2000 | McClintock et al. ......... 326/10 |
| 6,181,614 B1 | | 1/2001 | Aipperspach et al. |
| 6,199,177 B1 | | 3/2001 | Blodgett |
| 6,255,845 B1 | | 7/2001 | Wong et al. |
| 6,304,122 B1 | * | 10/2001 | Gregor et al. ............... 327/202 |
| 6,404,226 B1 | * | 6/2002 | Schadt ........................ 326/41 |
| 6,446,248 B1 | * | 9/2002 | Solomon et al. .............. 716/17 |
| 6,614,263 B2 | * | 9/2003 | Nadeau-Dostie et al. ..... 326/93 |

FOREIGN PATENT DOCUMENTS

DE 40 38 610 C1 5/1992

OTHER PUBLICATIONS

T.L. Floyd, *Digital Fundamentals*, Chapter 7—"PLD Arrays and Classifications", $6^{th}$ Edition, New Jersey, 1997, pp. 338–345.

* cited by examiner

Primary Examiner—Patrick Wamsley
(74) Attorney, Agent, or Firm—Thomas Schneck

(57) ABSTRACT

A fully self-sufficient configurable spare gate cell that has two types of inputs: a functional input bus and an equation input bus, whereby the spare gate cell can be transformed into any sum of product operator by the assertion of certain signals to the equation input bus. In a spare state, the functional input buses are connected to an area of predefined logic where the need for bug fixes are high. Thus, the spare cell would be automatically placed close to the bug-fix area during the place-and-route phase of chip design, thereby reducing the need to look for routing channels.

15 Claims, 2 Drawing Sheets

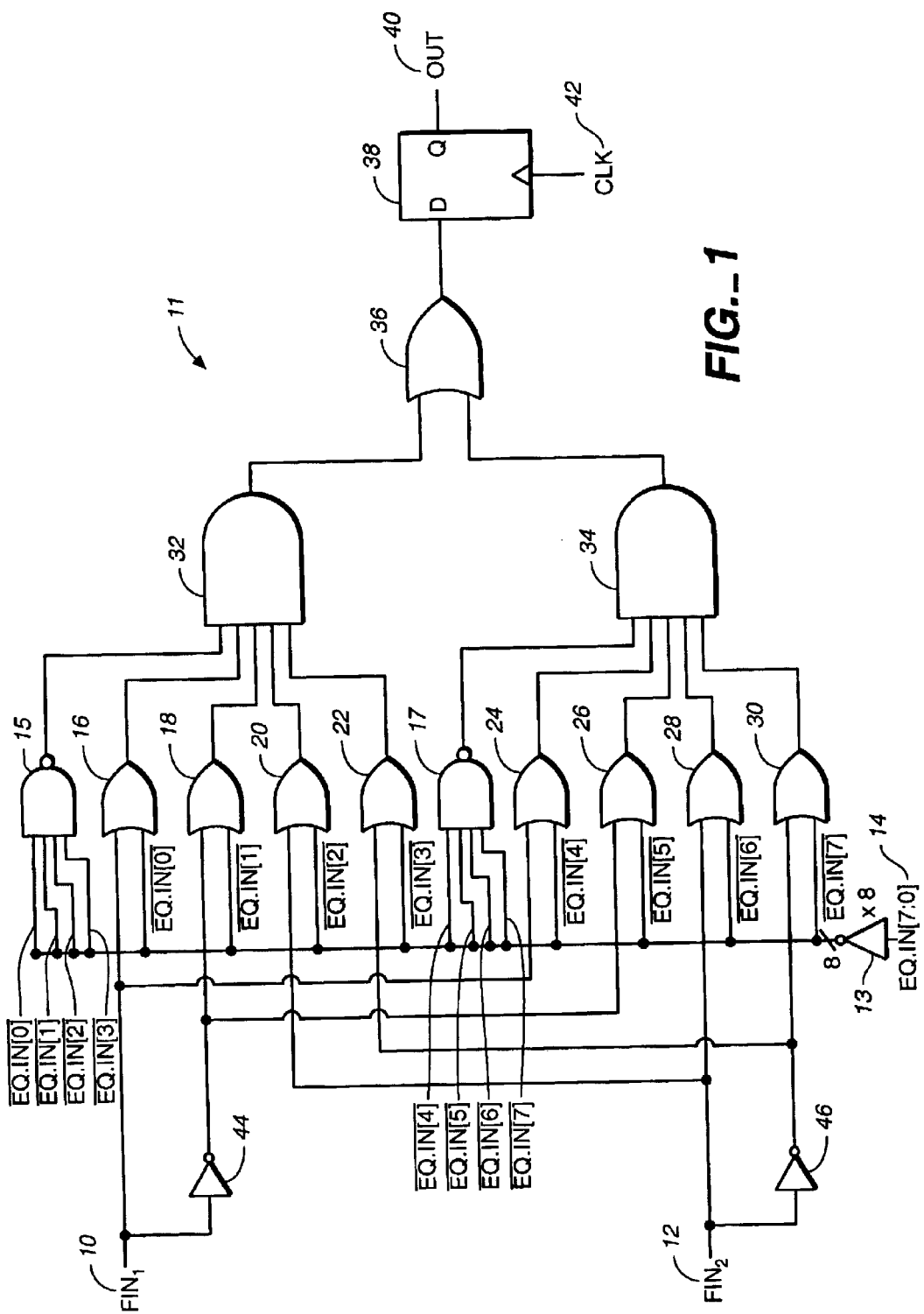
FIG._1

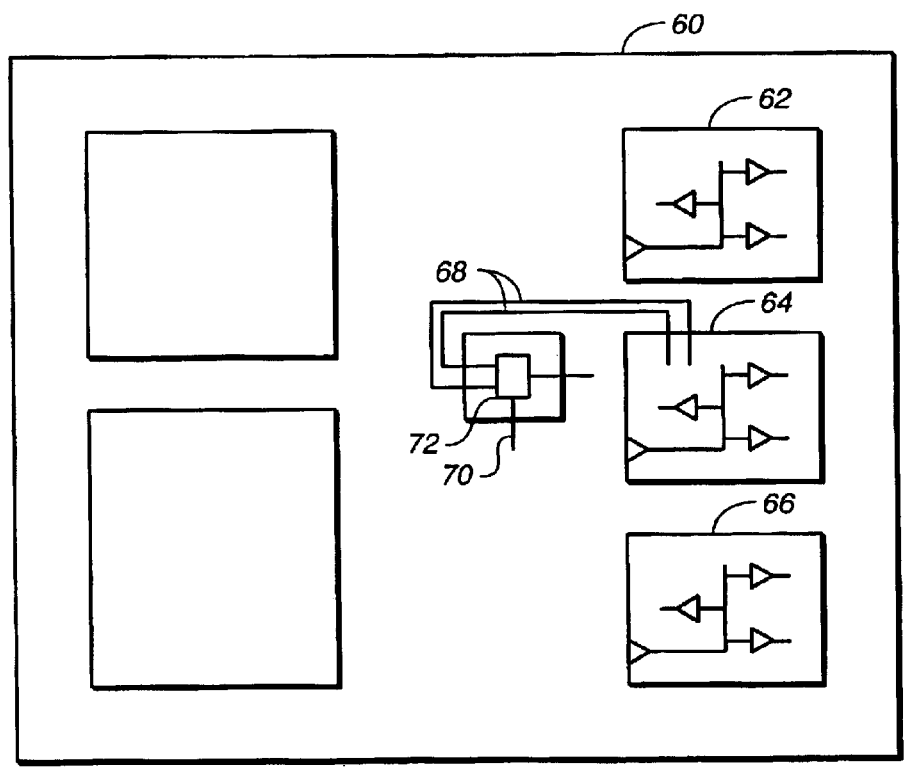
*FIG._2*
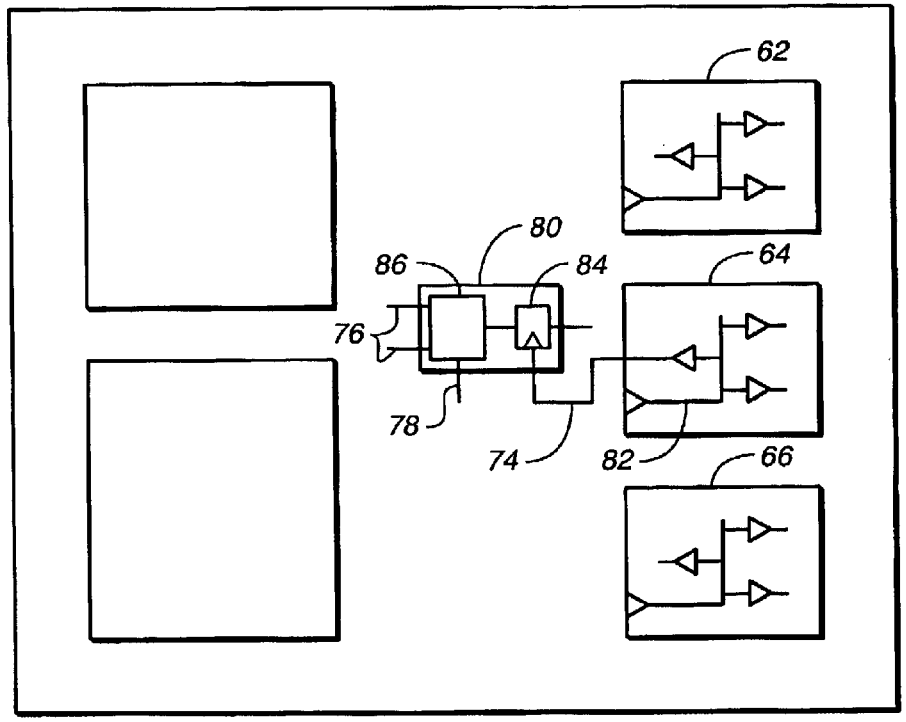
*FIG._3*

SPARE CELL ARCHITECTURE FOR FIXING DESIGN ERRORS IN MANUFACTURED INTEGRATED CIRCUITS

TECHNICAL FIELD

The present invention relates to a method and apparatus for the repair of integrated circuits. In particular, the present invention relates to spare cell architecture and the placement and the connection thereof in integrated logic circuits.

BACKGROUND ART

Although a variety of tools and techniques are available to check and verify a new integrated circuit (IC) design before it is submitted to the manufacturing line for production, there are design errors that cannot be detected until the design has been fully implemented, fabricated and tested at wafer and/or module level. In memory and logic circuits, redundancy can be built into the design so that spare cells are available for repair purposes. Once a design defect has been identified, it has to be isolated and replaced, or connected in a different manner or way. The isolation is typically performed by a focused ion beam (FIB), which cuts off connections to the defective cell by ion sputtering. With the addition of reactive gases and adjustments to operating parameters, ion-induced deposition of conductive material can be performed as well. This provides chip designers with the ability to evaluate the result of a fix before committing to a design change by metal layer change that is cost effective, as the designers could use a FIB machine to validate the fix before generating a new metal layer.

Replacement comes in the form of spare cells that are typically scattered around the IC. A traditional way to repair such design defects in logic circuits is to scatter redundant logic gates, such as AND gates and OR gates, around the circuit to be used as replacements. This method is acceptable so long as the defective circuit elements being replaced are also simple AND or OR gates. Complications arise when a replacement cell is needed for a more complicated logic function. For instance, to replace an XOR function, one would need to connect together two AND gates and one OR gate. However, since the simple logic gates are typically individually scattered around the circuit, the wiring that is required to string them together can get quite convoluted. Furthermore, as more and more components are being packed into smaller and smaller chip spaces, it is becoming more difficult to find routing paths to wire the simple replacement gates together to form a more advanced gate and to redirect the inputs and outputs of the defective logic. An alternative would be to scatter a complete library of logic functions throughout the circuit. However, this is not a cost effective solution because only a few of the functions in the library will be used and a lot of them will sit idle.

A more versatile solution calls for the use of configurable logic blocks. For instant, U.S. Pat. No. 6,255,845 to Wong et al. teaches the combination of one or more inverters with a configurable logic building block, like a multiplexer, to form a spare cell that can be configured to perform a plurality of different logic-gate functions. Initially, the inputs and outputs of the inverters and the configurable logic block are not connected together in any particular manner. In their spare state, the inputs of all circuits within the spare cell are tied to a reference voltage, e.g. Vcc or Vss, available on the IC. To use the spare cell, one or more input connections to the reference voltage are cut, and the inputs and outputs are selectively interconnected to each other and/or to signals and elements of the pre-defined logic circuit on the chip. The teachings of Wong et al. help reduce the number of spare cells needed, as well as the number of connection needed to form advanced gates. However, in some cases, routing paths may need to be found to bridge the inverters to the reconfigurable logic block, and, if necessary, from the reconfigurable logic block to a flip-flop. Since the dense circuitry used in most IC chips causes it to be difficult to find routing paths and since making electrical connections with FIB is a slow process, one objective of the present invention is to provide a spare cell structure that does not require as many internal connections to activate. The spare cell logic described in the Wong et al. patent does not take into account the path routings for any logic equation that can be implemented by the spare cells.

Another critical problem confronting IC layout designers is the need to have a balanced clock tree in order to maintain synchronous logic. However, the need to connect clock pins of the flip-flops through routing paths of unpredictable distances to the existing clock trees can easily disrupt a delicately balanced clock tree. Therefore,. it is another objective of the present invention to provide a spare cell structure that does not upset a predefined balanced clock tree.

SUMMARY OF THE INVENTION

The above objectives have been achieved by spare cells in the form of configurable combinatorial networks (CCN) that are placed strategically throughout a custom IC as spare cells. The spare cells can be configured to perform a variety of Sum of Product (e.g. XOR, NOR, or more complex logical functions) logic functions, without the need for additional inverters, by connecting either a power supply or ground to specific locations using metal layer modification. There are two input buses feeding into a CCN: a functional input bus and an equation input bus; each of these buses having different functions. The output of the CCN can be connected to a D flip-flop (DFF) having its clock pin connected to a predefined clock tree. The functional input bus carries data for the CCN, while the equation input bus carries the configuration control signals that specify the function of the CCN.

To facilitate efficient FIB repairs, the spare cell CCN, and DFFs are placed (during the integrated circuit's design phase) near a logic area where a need for defective cell replacement is determined to be highly probable. Connection paths between a spare cell and the nearby logic area are defined in such a way that automatic placement routing is guaranteed to be present near the desired logic area, so that the activation of the CCN would not upset the delicately balanced clock tree.

BRIEF DESCRIPTION OF THE DRAWINGS

FIG. 1 is a logic circuit diagram of a preferred embodiment of a spare cell of the present invention, which is in the form of a configurable combinatorial network (CCN) and associated D flip-flop (DFF).

FIG. 2 is a block diagram showing a way to connect a spare cell to a pre-defined logic area without a DFF.

FIG. 3 is a block diagram showing another way to connect a spare cell to a pre-defined logic area with a DFF.

BEST MODE FOR CARRYING OUT THE INVENTION

In the preferred embodiment of the present invention, as shown in FIG. 1, the spare cell 11 is made up of a plurality of OR gates having a first and second inputs, acting as input gates for a first and second functional input terminals FIN1 10 and FIN2 12 and an equation input bus terminal EqIN 14 that carries a first equation input signal line EQIN[0], a second equation input signal line EQIN[1], a third equation input signal line EQIN[2], a fourth equation input line EQIN[3], a fifth equation input line EQIN[4], a sixth equation input line EQIN[5], a seventh equation input line EQIN[6] and an eighth equation input signal line EQIN[7]. The equation input lines EQIN[7:0] are negated by a first bank of eight inverters 13, one for each equation input line. The first functional input terminal 10 is connected to the first inputs of first and second OR gates 16 and 24 and the input of a second inverter 44. The output of the second inverter 44 is connected to the first inputs of a third and fourth OR gates 18 and 26. The second functional input terminal 12 is connected to the first inputs of fifth and sixth OR gates 20 and 28, and to an input of a third inverter 46. The output of the third inverter is connected to the first input of seventh and eighth OR gates 22 and 30. The first equation input signal line EQIN[0] connects to the second input of the first OR gate 16. The second equation input signal line EQIN[1] connects to the second input of the third OR gate 18. The third equation input signal line EQIN[2] connects to the second input of the fifth OR gate 20. The fourth equation input signal line EQIN[3] connects to the second input of the seventh OR gate 22. The fifth equation input signal line EQIN[4] connects to the second input of the second OR gate 24. The sixth equation input signal line EQIN[5] connects to the second input of the fourth OR gate 26. The seventh equation input signal line EQIN[6] connects to the second input of the sixth OR gate 28. The eighth equation input signal line EQIN[7] connects to the second input of the eighth OR gate 30. The first four equation input signal lines EQIN[3:0] also connect to a first 4-input NAND gate 15 while the last four equation input signal lines EQIN[7:4] connect to a second 4-input NAND gate 17. The outputs of the first, third, fifth and seventh 2-input OR gates 16, 18, 20, 22 and the output of the first 4-input NAND gate 15 are connected to the inputs of a first 5-input AND gate 32. The outputs of the second, fourth, sixth and eighth OR gates 24, 26, 28, 30 and the output of the second 4-input NAND gate 17 are connected to the inputs of a second 5-input AND gate 34. The outputs of the first and second 5-input AND gates 32 and 34 are connected to inputs of a ninth 2-input OR gate 36. For applications where the output requires a D flip-flop (DFF), the output of the ninth 2-input OR gate 36 would be connected to the input of a DFF 38. The clock pin of the DFF 38 is connected to an existing clock tree in the predefined logic area where the need for a bug fix is probable. The scan data input pin of the DFF 38 can be connected to the logic scan chain of the predefined logic.

One of the strengths of the present invention lies in the fact that the CNN obeys a given formula as it is illustrated by the following example, wherein the replacement calls for an exclusive OR (XOR) gate. The logic equation for XOR gate can be expressed as follows:

$$OUT = (FIN_1 \overline{FIN_2}) + (\overline{FIN_1} FIN_2)$$

The equation above may be mapped onto the CCN formula as shown below:

$$OUT[0] = (\overline{FIN_2} + \overline{EQIN[7]}) \cdot (FIN_2 +$$

$$\overline{EQIN[6]}) \cdot (\overline{FIN_1} + \overline{EQIN[5]}) \cdot$$

$$(FIN_1 + \overline{EQIN[4]}) \cdot (EQIN[7] + EQIN[6]$$

$$+ EQIN[5] + EQIN[4]) +$$

$$(\overline{FIN_1} + \overline{EQIN[3]}) \cdot$$

$$(FIN_2 + \overline{EQIN[2]}) \cdot$$

$$(\overline{FIN_1} + \overline{EQIN[1]}) \cdot$$

$$(FIN_1 + \overline{EQIN[0]}) \cdot$$

$$(EQIN[3] + EQIN[2] + EQIN[1]$$

$$+ EQIN[0])$$

This dictates that the output of the first and second 5-input AND gates 32 and 34 have to be $FIN_1 \overline{FIN_2}$ and $\overline{FIN_1} FIN_2$ respectively. In order to produce such outputs, the inputs to the first 5-input AND gate 32 should have a $FIN_1$ and a $\overline{FIN_2}$ and three 1s, while the inputs to the second 5-input AND gate 34 should have a $\overline{FIN_1}$ and a $FIN_2$ and three 1s. In order to present a $FIN_1$ and not $\overline{FIN_1}$ to the input of the first 5-input AND gate 32, the equation input $\overline{EQIN[0]}$ to the first 2-input OR gate 16 must be a "0" and the equation input $\overline{EQIN[1]}$ to the third 2-input OR gate 18 must be a "1". By the same token, in order to present a $\overline{FIN_2}$ but not a $FIN_2$ at the input of the first 5-input AND gate 32, the equation input $\overline{EQIN[2]}$ to the fifth 2-input OR gate 20 must be a 1 and the equation input the seventh 2-input OR gate $\overline{EQIN[3]}$ must be a "0". Since at least one of the four equation input signal lines is a 1, the output of the first 4-input NAND gate 15 must be a 1 as well. To provide a $\overline{FIN_1} FIN_2$ at the output of the second 5-input AND gate 34, the inputs must consist of a $\overline{FIN_1}$, a $FIN_2$, and three 1s. This can be accomplished by sending a "1" to the equation input $\overline{EQIN[4]}$ of the second 2-input OR gate 24, a "0" to the equation input $\overline{EQIN[5]}$ of the fourth OR gate 26, a "0" to the equation input $\overline{EQIN[6]}$ of the sixth OR gate 28, and a "1" to the equation input of the eighth OR gate 30 $\overline{EQIN[7]}$. Since at least one of the four equation input signal lines is a 1, the output of the second 4-input NAND gate 17 must be a 1 as well. So, in summary, in order to configure the CCN into an XOR gate, and taking into account the first inverter 13, the signals appearing at the equation inputs of the eight 2-input OR gates EQIN[7:0] should have the following sequence: 0110 1001.

The first and second 4-input NAND gate 15, 17 are useful for generating simple function like AND and OR. For instance, to turn the CCN into a simple AND gate, the formula to implement is:

$$OUT = FIN_1 \cdot FIN_2$$

The resulting signal at the equation input signal line EQIN [7:0] would be 00000101. The four is in $\overline{EQIN[7:4]}$ ensure a 0 output from the second 4-input NAND gate 17, which in turn ensure a 0 output from the second 5-input AND gate 34.

These equation input signals 14 for the equation input can be generated during defective cell replacement by connecting the second, third, fifth and eighth wires in the bus to the power supply using the FIB system and by leaving the remaining wires connected to the ground. To further minimize FIB repair or metal layer reprocessing, one may connect the input bus to a special function register of the predefined logic that can be loaded with a specific eight digit binary number through any serial or parallel means such as SCAN, JTAG, and software user interface.

In today's highly modulized integrated circuits, a typical microcontroller might include a processor core, a memory module, an external bus interface, module, and internal bus, a plurality of timer modules, and various serial and parallel peripheral interface module, such as modules for universal synchronous asynchronous receiver transmitter (USART), universal serial bus (USB), and parallel bus. These modules are typically at various stages of development. Some of these module designs have been used repeatedly in various circuits and thus the need for defective cell replacement are low, while other circuits may have just been implemented for the first time and, thus, the chance for requiring bug fixes is high. Therefore, strategically placing spare cells near modules of the latter type would significantly reduce the routing distances and improve defect repair efficiency. However, current place-and-route tools tend to place unconnected spare cells randomly, with all of the inputs connected to ground. A place-and-route engineer will have to find routing paths in case of metal fix repair. The unique separation of inputs in the present invention enables a designer to connect the functional inputs of the spare cells to an area where the needs for defective cell replacement are highly probable without modifying the predefined functionality, while keeping the equation inputs connected to ground. This way, the spare cells would be automatically placed by the place-and-route tools near areas where defective cell replacement is most likely.

In FIG. 2, an integrated circuit chip 60 with a plurality of peripheral functional modules such as a Universal Synchronous Asynchronous Receiver Transmitter (USART) 62, Universal Serial Bus (USB) 64 and Serial Peripheral Interface (SPI) 66 is shown. In the case where it has been determined that the USB 64 is the module with a high probability for requiring defective cell replacement, then during the design phase, the functional inputs 68 of the spare cells are connected to the existing functional signals (sequential or combinational gate outputs) of the USB 64 logic area where the need for defective cell replacement is most probable. As a result, not only will there be preexisting routing paths for the functional inputs 68 that can be used for defective cell replacement, but also the place-and-route tool would automatically place the CCN 72 close to the USB 64 module, thereby reducing the distance of the routing paths for the output of the CCN 72.

For defective cell replacement that call for an output with a D flip-flop, an alternative connection, shown in FIG. 3, is possible. In FIG. 3, the clock pin 74 of the DFF 84 in the spare gate cell 80 could be connected to a branch of a clock tree 82 in the USB 64 in its spare state, thereby eliminating the need of connecting the clock pin when defective cell replacement is needed, potentially inducing clock tree imbalance. Furthermore, since the clock pin connection 74 would force the place-and-route tool to place the DFF 84 close to the area of the chip where the need for defective cell replacement is high, and since the output of the CCN 86 is connected to the DFF 84, the functional inputs 76 would be located near defective cell replacement area, thereby reducing the potential routing distance of functional inputs 76.

Although only one embodiment of the configurable combinational logic has been shown in the proceeding paragraphs, one skill in the art will, after seeing the disclosed invention, quickly recognize that there are other ways to realize a sum of product logical function using simple combination logic cells. It is also possible that multi CCN could be connected together to form a single spare gate cell.

What is claimed is:

1. In a integrated circuit having a plurality of interconnected logic cells, potentially including at least one defective logic cell, a plurality of spare cells dispersed within the integrated circuit for the replacement of any said defective logic cells, each spare cell comprising:

a configurable combinatorial network (CCN) implementing any of a plurality of sum of product logical functions, said CCN having a plurality of equation input terminals that receive control signals which configure the CCN to perform one or more specified logical functions, a plurality of functional input terminals; and one or more output terminals selectively connectable to the integrated circuit through a D flip-flop to replace a defective logic cell, so as to receive variable data signals, from the integrated circuit and to output to the integrated circuit a result of the specified logical function performed upon the data signals, wherein a clock pin of the D flip-flop is connected to a preexisting clock tree in an area of the integrated circuit wherein has been determined that a need for defective cell replacement is highly probable.

2. The spare gate cell of claim 1, wherein a scan data input pin of the D flip-flop is connected to a pre-existing clock tree in an area of the integrated circuit where it has been determined that a need for defective cell replacement is highly probable.

3. The spare gate cell of claim 1, wherein at least one of the plurality of functional input terminals is connected in its spare state to area of the integrated circuit in which a need for defective cell replacement has been determined to be highly probable.

4. The spare cell of claim 1, wherein at least one of the plurality of functional input terminals is connected in its spare state to an area of the integrated circuit where it has been determined that a need for defective cell replacement is highly probable and a D flip-flop is connected to a clock tree in the same area.

5. The, spare gate cell of claim 1, wherein the equation input terminals are connected arbitrarily to power terminals or power ground terminals when the CCN is in a spare state, and wherein the equation input terminals are selectively connected to power supply terminals through metal layer modifications when the CCN is an active state, thereby transforming the CCN into a specific combinational network.

6. The spare gate cell of claim 1, wherein the equation input terminals are connected to a register, the logical function of the CCN being determined by a value that is stored in the register that can be accessed through any serial and parallel means.

7. The spare gate cell of claim 1, wherein the CCN is comprised of a first, second, third, fourth, fifth, sixth, seventh, and eighth 2-input OR gates, each having a first and a second input and an output, and a first and second 4-input NAND gate, each having four inputs and one output, the first input of the first OR gate being connected to a first functional input terminal, the first input of the second OR gate being connected to a complement of said first functional input, the first input of the third OR gate being connected to a second functional input terminal, the first input of the fourth OR gate being connected to a complement of said second functional input, the first input of the fifth OR gate being connected to said first functional input terminal, the first input of the sixth OR gate being connected to a complement of said first functional input, the first input the seventh OR gate being connected to said second functional input terminal, the first input of the eighth OR gate being connected to a complement of said second functional input, wherein the second inputs of the first, second, third, fourth, fifth, sixth, seventh, and eighth OR gates being connected to a first, second, third, fourth, fifth, sixth, seventh, and eighth equation input signal lines, each of which is connected to one of the equation input terminals through an inverter, the first, second, third and fourth equation input signal lines being connected to inputs of the first 4-input NAND gate and the fifth, sixth, seventh and eighth equation input signal lines being connected to inputs of the second 4-input NAND gate, wherein the outputs of the first, second, third and fourth 2-input OR gates and the output of the first 4-input OR gate being connected to a first 5-input AND gate and the outputs of the fifth, sixth, seventh, and eighth OR gates and the output of the 4-input OR gate being connected to a second 5-input AND gate, each of the first and second 5-input AND gates having five inputs and a single output, wherein the output of the first and second 5-input AND gates being connected to a ninth 2-input OR gate having two inputs and an output, said output of the ninth OR gate being connected to the output terminal of the CCN, whereby the CCN performs a specific sum-of-product combinational logical operation on the functional inputs, as determined by the connections of selected equation inputs to power supply, and output the result at the output terminal of the CCN.

8. In an integrated circuit having a plurality of interconnected logic cells, potentially including at least one defective logic cell, a plurality of spare cells dispersed within the integrated circuit for the replacement of any said defective logic cells, each spare cell comprising:

a configurable combinatorial network (CCN) for implementing any of a plurality of sum-of-product logic functions, said CCN having a plurality of functional input terminals that receive variable data signals from the integrated circuit, a plurality of equation input terminals that receive control signals which configure the CCN to perform one or more specified logical functions, and one or more output terminals that output a result of the logical function performed upon the data signals through a D flip-flop having a clock pin that is connected to a preexisting clock tree, wherein at least one of the plurality of functional input terminals is connected in its spare state to an area of the integrated circuit in which a need for defective cell replacement has been determined to be highly probable.

9. The spare gate cell of claim 8, wherein the equation input terminals are arbitrarily connected to power ground terminals or power supply terminals when the CCN is in a spare state, and wherein the equation input terminals are selectively connected to power supply terminals through metal layer modifications when the CCN is an active state, thereby transforming the CCN into a specific combinational network.

10. The spare gate cell of claim 8, wherein the equation input terminals are connected to a register, the logical function of the CCN being determined by a value that is input to the register that can be accessed through any serial and parallel means.

11. The spare gate cell of claim 8, wherein the CCN is comprised of a first, second, third, fourth, fifth, sixth, seventh, and eighth 2-input OR gates, each having a first and a second input and an output, and a first and second 4-input NAND gates each having four inputs and one output, the first input of the first OR gate being connected to a first functional input terminal, the first input of the second OR gate being connected to a complement of said first functional input, the first input of the third OR gate being connected to a second functional input terminal, the first input of the fourth OR gate being connected to a complement of said second functional input, the first input of the fifth OR gate being connected to said first functional input terminal, the first input of the sixth OR gate being connected to a complement of said first functional input, the first input the seventh OR gate being connected to said second functional input terminal, the first input of the eighth OR gate being connected to a complement of said second functional input, wherein the second inputs of the first, second, third, fourth, fifth, sixth, seventh, and eighth OR gates being connected to a first, second, third, fourth, fifth, sixth, seventh and eighth equation input signal lines, each of which is connected to one of the equation input terminals through an inverter, the first, second, third and fourth equation input signal lines being connected to the inputs of the first 4-input NAND gate and the fifth, sixth, seventh and eighth equation input signal lines being connected to the inputs of the second 4-input NAND gate, wherein the outputs of the first, second, third and fourth 2-input OR gates and the output of the first 4-input NAND gate being connected to a first 5-input AND gate and the outputs of the fifth, sixth, seventh, and eighth OR gates and the output of the second 4-input NAND gate being connected to a second 5-input AND gate, each of the first and second 5-input AND gates having five inputs and a single output, wherein the output of the first and second 5-input AND gates being connected to a ninth OR gate having two inputs and an output, said output of the ninth OR gate being connected to the output terminal of the CCN, whereby the CCN performs a specific sum-of-product combinational logical operation on the functional inputs, as determined by the connections of selected equation inputs to power supply, and output the result at the output terminal of the CCN.

12. In an integrated circuit, a method for replacing a defective logic cell comprising:

identifying at least one area of an integrated circuit where defective cell replacement is likely to be required;

placing a spare cell having a configurable combinatorial network in each area of the integrated circuit where defective cell replacement is likely to be required;

connecting a D flip-flop to an output terminal of said spare cell;

connecting a clock pin in said D flip-flop to an existing clock tree;

connecting any functional inputs of the configurable combinatorial network to any existing functional signals of the logic area where defective cell replacement is likely to be required; and configuring and activating the spare cell whenever defective cell replacement is required.

13. The method of claim 12, further including deactivating a defective cell.

14. The method of claim 13, wherein the deactivation step is accomplished through metal layer modification.

15. The method of claim 12, wherein the activation step is accomplished through metal layer modification.

* * * * *